United States Patent [19]
Ouchi et al.

[11] Patent Number: 6,072,879
[45] Date of Patent: Jun. 6, 2000

[54] SOUND FIELD CONTROL UNIT AND SOUND FIELD CONTROL DEVICE

[75] Inventors: Kunihiro Ouchi; Hiroaki Furuta; Akio Suyama; Yasushi Shimizu, all of Hamamatsu, Japan

[73] Assignee: Yamaha Corporation, Hamamatsu, Japan

[21] Appl. No.: 08/861,329

[22] Filed: May 21, 1997

[30] Foreign Application Priority Data

Jun. 17, 1996 [JP] Japan ...................................... 8-177016
Mar. 12, 1997 [JP] Japan ...................................... 9-076623

[51] Int. Cl.⁷ ............................................. H03G 3/00
[52] U.S. Cl. ........................................... 381/61; 381/103
[58] Field of Search ............................. 381/61, 63, 103, 381/98, 56, 62; 84/626, 630, 662

[56] References Cited

U.S. PATENT DOCUMENTS

| | | | |
|---|---|---|---|
| 5,065,432 | 11/1991 | Sasaki et al. | 381/61 |
| 5,073,942 | 12/1991 | Yoshida et al. | 381/61 |
| 5,123,051 | 6/1992 | Koinuma | 381/63 |
| 5,257,313 | 10/1993 | Fujishita et al. | 381/63 |
| 5,633,993 | 5/1997 | Redmann et al. | 381/61 |

*Primary Examiner*—Vivian Chang
*Attorney, Agent, or Firm*—Pillsbury Madison & Sutro LLP

[57] ABSTRACT

A sound field control unit includes a microphone collecting sound about a self-unit, a collected sound signal input-output terminal for outputting a collected sound signal of the self-unit to outside of the self-unit and inputting a collected sound signal of other units to the self-unit, a collected sound signal switch for switching the collected sound signal collected by the self-unit and that collected by the other units sequentially and repeatedly, an FIR filter for producing a reflected sound component of the collected sound signals provided by the switch and imparting it to the collected sound signals, an amplifier for amplifying the imparted reflected sound component and the collected sound signal, an equalizer provided in a signal path between an output terminal of the collected sound signal switch and an input terminal of the amplifier for adjusting frequency characteristic of a signal flowing through the signal path, and a loudspeaker for reproducing the amplified output signal. These components are assembled integrally together in the self-unit and the self-unit is adapted to be connected to the other units through the collected sound signal input-output terminal by means of transmission cables.

8 Claims, 14 Drawing Sheets

FREQUENCY CHARACTERISTIC OF SELF – LOOP

TERGET LEVEL (−1.5dB)

SMOOTHING

FREQUENCY CHARACTERISTIC AFTER AUTOMATIC ADJUSTMENT

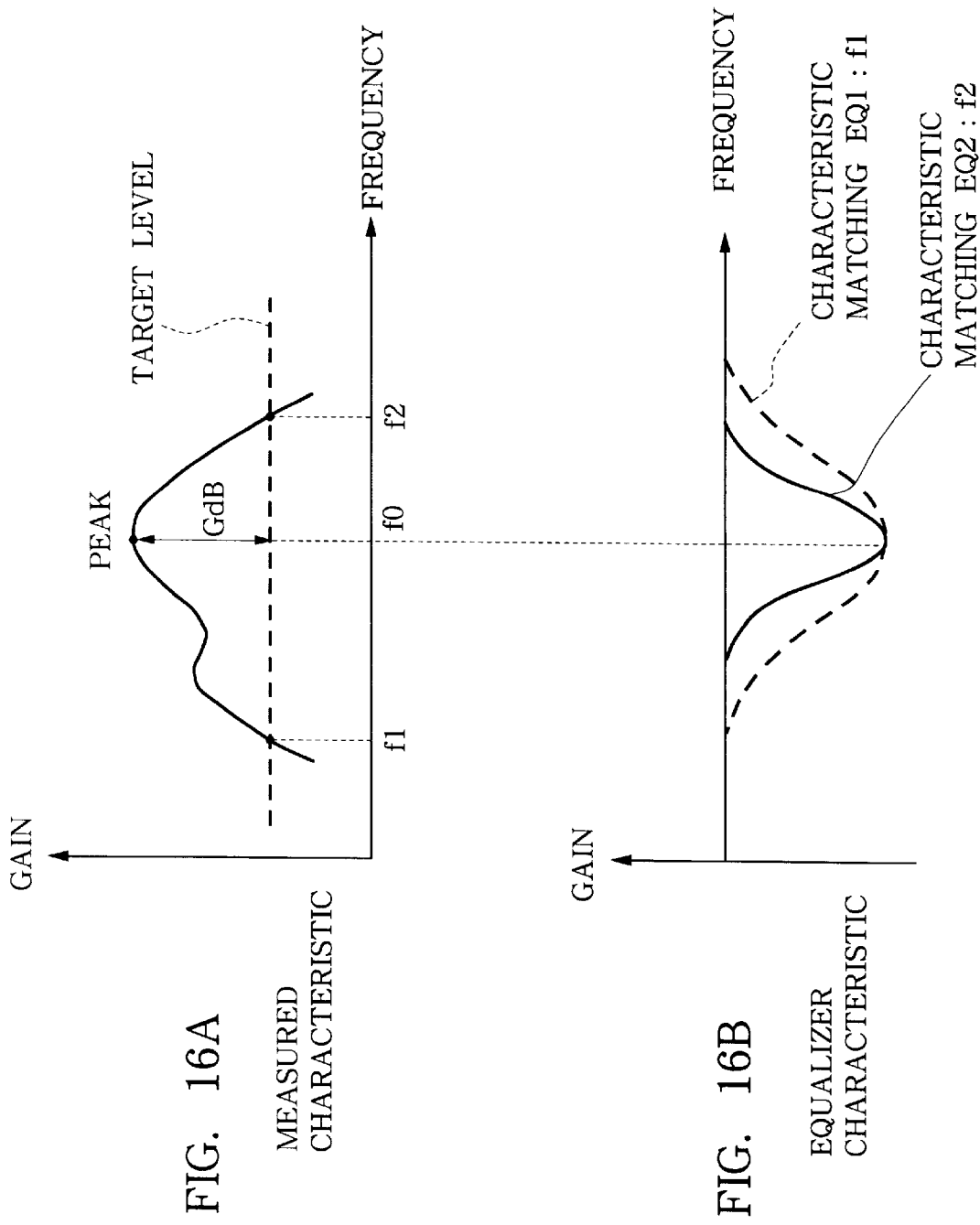
FIG. 16A MEASURED CHARACTERISTIC
FIG. 16B EQUALIZER CHARACTERISTIC

SOUND FIELD CONTROL UNIT AND SOUND FIELD CONTROL DEVICE

BACKGROUND OF THE INVENTION

This invention relates to a sound field control unit and a sound field control device which, on the basis of existing acoustic conditions in a room, supports a sound field by reinforcing acoustic effects such as sound volume, reverberation and acoustic spaceousness by electrical acoustic means and, more particularly, to a sound field control unit and a sound field control device of this type facilitating introduction of a sound field support system.

There is a prior art acoustic feedback system for electro-acoustically realizing a control such as prolongation of reverberation. The principle of this system is shown in FIG. 2. In this system, a loudspeaker 12 and a microphone 14 are provided with a proper distance therebetween in a room 10 and sound collected by the microphone 14 is supplied to an FIR (finite impulse response) filter 18 through a head amplifier 16 to produce a reverberation signal (mainly an initial reflected sound signal). This reverberation signal is supplied to the loudspeaker 12 through an amplifier 20 and reverberation sound sounded from the loudspeaker 12 is collected by the microphone 14. It is intended to realize, by repeating this process, feeling of increase in sound volume (i.e., increase in sound pressure level), increase in reverberation and increase in spaceousness of sound (i.e., increase in side reflected sound energy). According to this system, impression of a sound field as if the listener was listening to a musical performance in a large concert hall is created despite the fact that he is actually in a small room.

A prior art sound field control device using this acoustic feedback system is shown in FIGS. 3 and 4. FIG. 3 shows an arrangement of a microphone and a loudspeaker. In a room 22 such as a music chamber, four microphones 24 to 27 are disposed on the ceiling and four loudspeakers 30 to 33 are provided on the wall. A main body 36 of the device is constructed as an independent unit and is provided in the room 22.

FIG. 4 shows a circuit of this device. Signals collected by the microphones 24 to 27 are supplied through head amplifiers 38 to 41 to an equalizer 42 in which the signals are adjusted in frequency characteristics for preventing occurrence of howling. The signals are then supplied to an FIR filter 44 to produce initial reflected sound signals. The initial reflected sound signals are amplified by amplifiers 46 to 49 and sounded from the loudspeakers 30 to 33. A ROM 52 stores various initial reflected sound parameters of various sound field patterns. By selecting a sound field pattern by an outside infrared remote control transmitter-receiver 54, a corresponding sound field pattern selection signal 56 is transmitted and received by a receiving window 58 provided in the main body 36 of the device. A CPU 60 receives this signal and thereupon reads out an initial reflected sound parameter of the corresponding sound field and sets this parameter in the FIR filter 44 to establish a sound field space.

Adjustment of the frequency characteristics by the equalizer 42 is performed by either of the following methods:

(a) The equalizer 42 is constructed of an FIR filter. Characteristics of the room are previously measured and the characteristics of the FIR filter are preset to inverse characteristics of the characteristics of the room. Signals collected by the microphones 24 to 27 are subjected to convolution operation by the FIR filter 43 to flatten their frequency characteristics.

(b) The equalizer 42 is constructed of a notch filter. When howling occurs during use of the device, the notch filter is applied at this time to the frequency region in which the howling has occurred to prevent howling.

(c) The equalizer 42 is constructed of a graphic equalizer. An operating person adjusts the graphic equalizer manually to flatten the frequency characteristics while he measures the characteristics of the room.

In the prior art sound field control device employing the acoustic feedback system, location of microphones and loudspeakers is generally rearranged for securing safety against occurrence of howling when space (room) where they are placed has changed. In that case, locations of the microphones and the loudspeakers are changed and distance between the microphones and the loudspeakers is also changed each time space is changed. Adjustment after installation is conducted in such a manner that adjustments of open loop gain and transmission frequency characteristics are carried out for each combination of the microphones and loudspeakers by using special measuring instruments and then presence or absence of howling and coloration of tone quality are checked. Thus, installation and adjustment of the device require a long time and this becomes an obstacle to introducing the sound field support system.

Among the above described methods for adjusting frequency characteristics of the equalizer 42, the method using the FIR filter requires a high-class computer for dealing with a tremendous amount of calculation. The method using the notch filter cannot completely prevent occurrence of howling since the notch filter copes with howling after it has actually taken place. Moreover, in a case where many peaks exist over a broad frequency region in the frequency characteristics, a plurality of notch filters are required. The method using the graphic equalizer is very troublesome because adjustments are made manually.

It is, therefore, an object of the present invention to provide a sound field control unit and a sound field control device which can overcome the above described problems of the prior art device and facilitate introduction of the sound field support system.

SUMMARY OF THE INVENTION

According to the invention, at least a microphone, loudspeaker, collected sound signal switch, equalizer, FIR filter and amplifier are assembled integrally together in a unit and a plurality of such units are interconnected by means of transmission cables. Collected sound signals of other units are supplied via the transmission cables and, by switching a collected sound signal between one of the self-unit and one of the other units sequentially, the connecting state between the microphone and the loudspeaker is interchanged among the plural units. By this arrangement, the transmission characteristic between the microphone and the loudspeaker is averaged whereby reduction of coloration and enlargement of a howling margin can be realized. Accordingly, even if the distance between the microphone and the loudspeaker is fixed in one unit, coloration and howling are reduced and adjustment of loop characteristic is facilitated. Moreover, since the device is unitized, installment of the device is facilitated.

According to the invention, by varying parameters of the FIR filter continuously and randomly on time base, frequency characteristic of the FIR filter is averaged whereby coloration and howling are reduced still further.

By providing an infrared receiving section in each unit and transmitting a remote control signal received by one unit to other units through the transmission cables, a remote control operation can be realized in a broad range in the room so that operability is improved.

The unit can be constructed, for example, in the form of a vertically elongated cylindrical casing in which a loudspeaker is disposed so that sound is propagated upwardly from an upper end opening of the casing, a microphone is disposed on the side surface of the casing so as to collect sound about the casing, an electrical circuit portion is provided in the casing and a collected sound signal input-output terminal is provided at a location where a transmission cable can be connected from outside. By constructing the casing cylindrically, the loudspeaker can be istalled away from the microphone and, besides, since the loudspeaker and the microphone can be located facing different directions, the amount of sound reproduced from the self-unit and collected directly by the microphone of the self-unit is reduced and howling is thereby reduced.

In one aspect of the invention, the equalizer is constructed of a prior equalizer which is provided between the collected sound signal switch and the FIR filter and a posterior equalizer which is provided between the FIR filter and the amplifier and an attenuator is provided after the posterior equalizer. The prior and posterior equalizers and the attenuator are automatically adjusted by using a reference signal for measurement and a transmission characteristic measuring device. This automatic adjustment includes an automatic adjustment in an open loop state in which the output of the collected sound signal switch is fixed to the collected sound signal of the self-unit, a part of the signal path is interrupted to establish the open loop state, the reference signal for measurement is inputted from the interrupted part and reproduced by the loudspeaker, frequency characteristic of a signal collected by the microphone of the self-unit and fed back to the interrupted part at this time is measured by the measuring device, characteristic of the posterior equalizer is adjusted so as to flatten the frequency characteristic, and then the attenuator is adjusted so that gain of the loop becomes a predetermined value, and an adjustment in a closed loop state in which the loop is closed and the reference signal for measurement is supplied to the loop while switching operation by the collected sound signal switch is performed, frequency characteristic of the loop is measured by the measuring device and the characteristic of the equalizer is adjusted so as to flatten the frequency characteristic.

The posterior equalizer can be constructed of a parametric equalizer in which a center frequency, gain and Q can be set. In this case, the automatic adjustment of the posterior equalizer is conducted, for example, such that the measured frequency characteristic is compared with a predetermined target gain and a peak frequency in a portion where the gain exceeds the target gain in the frequency characteristic, difference between the gain at the peak frequency and the target frequency and frequencies at crossing points at which the frequency characteristic crosses the target gain on both sides of the peak frequency are respectively detected, a degree of sharpness of the characteristic is obtained on the basis of the peak frequency, gain difference and frequencies at the crossing points, and the center frequency, gain and Q of the posterior equalizer are determined so as to match the detected or calculated peak frequency, gain difference and the degree of sharpness.

The prior equalizer can be constructed of a parametric equalizer in which the center frequency and gain can be set and Q is fixed. In this case, the automatic adjustment of the prior equalizer is conducted, for example, such that the measured frequency characteristic is compared with a predetermined target gain and a peak frequency in a portion where the gain of the frequency characteristic exceeds the target gain and a difference between the gain at the peak frequency and the target gain are respectively detected, and the center frequency and the gain of the prior equalizer are set so as to match the detected peak frequency and gain difference.

According to the automatic adjustment using the parametric equalizer, the parametric equalizer can be constructed of, e.g., an IIR filter and, accordingly, the adjustment can be achieved relatively simply with a relatively small amount of computation. Moreover, the parametric equalizer can flexibly cope with a peak of frequency characteristic distributed over a wide range. Further, since the adjustment is conducted prior to use of the sound field control device, howling can be prevented before occurrence thereof.

Thus, according to the invention, introduction of a sound field support system is facilitated.

Preferred embodiments of the invention will be described below with reference to the accompanying drawings.

BRIEF DESCRIPTION OF THE DRAWINGS

In the accompanying drawings,

FIGS. 16A and 16B are diagrams for explaining processing of steps S15 to S16 in the routine of FIG. 14 in a partly enlarged scale.

DESCRIPTION OF PREFERRED EMBODIMENT

Figure 5:
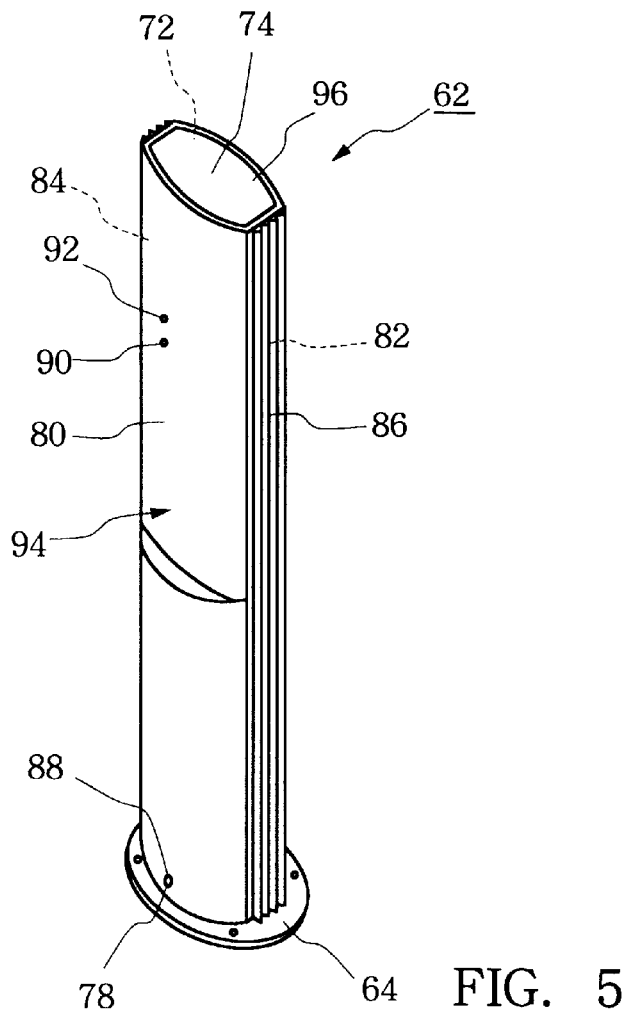
FIG. 5 is a perspective view showing the appearance of an example of the sound field control unit of the invention.

FIG. 5 shows an embodiment of the sound field control unit according to the invention. An exploded view of the unit of FIG. 5 is shown in FIG. 6.

Figure 6:
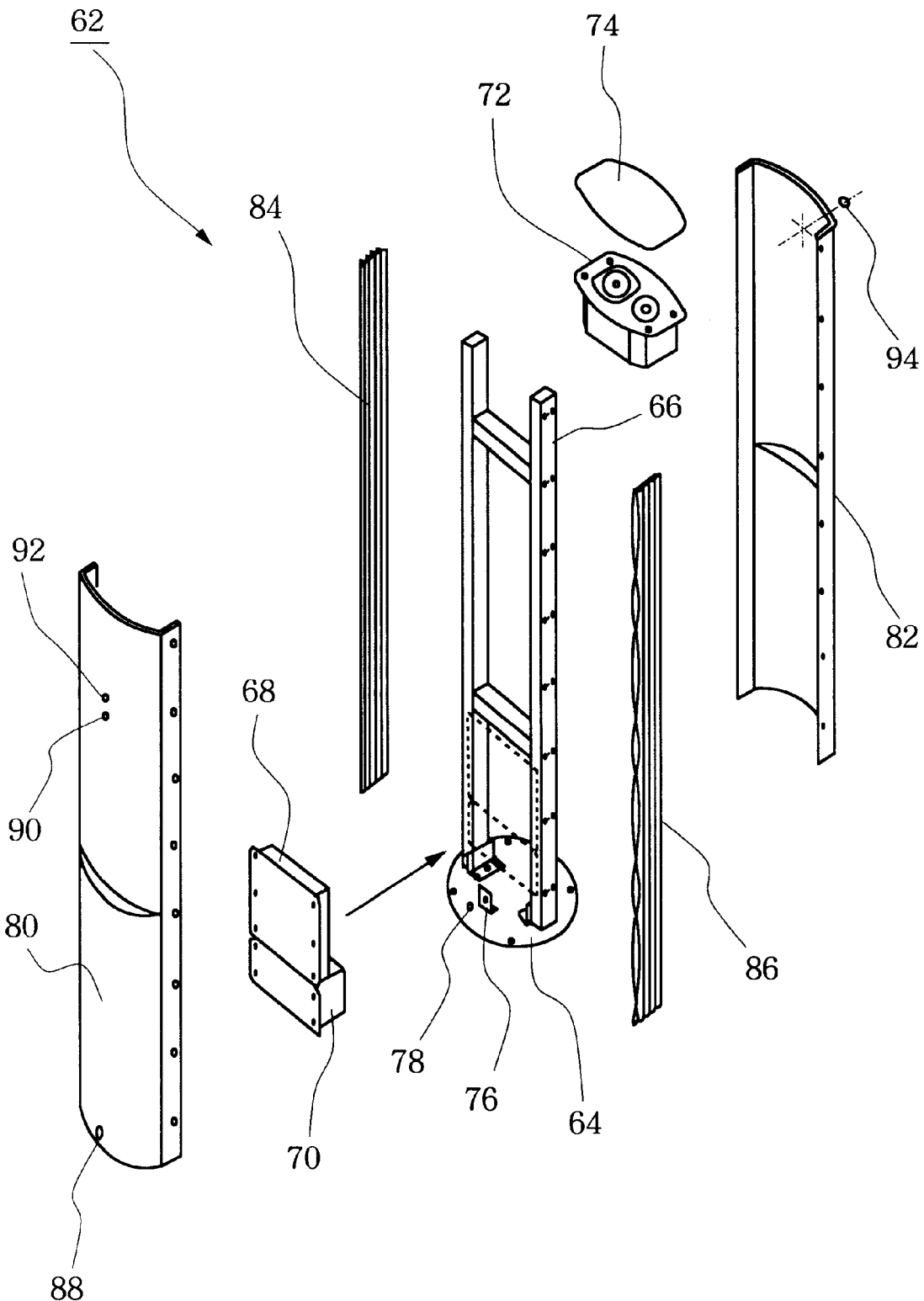
FIG. 6 is an exploded view of the sound field control unit shown in FIG. 5.

A sound field control unit 62 has, as shown in FIG. 6, a frame 66 erected on a base 64. On the frame 66 are mounted a circuit unit 69 and an amplifier 70. An amplifier having a capacity in the order of 200 Wmax, for example, can be used as the amplifier unit 70. On the upper end portion of the frame 66 is mounted a loudspeaker system 72 with propagation of sound being directed upward. A loudspeaker grill 74 is mounted on a propagating suface of the loudspeaker system 72. A microphone holder 76 is fixed on the base 64 and a microphone unit 78 is mounted on the microphone holder 76. As the microphone unit 78, a nondirectional electrostatic type microphone (condenser microphone), for example, can be used. The location of mounting of the microphone unit 78 is not limited to the lower portion of the sound field control unit 62 but may be other portion so long as it is a location where a sound field can be received flatly.

A front cover 80 and a rear cover 82 which constitute a casing are mounted on the front and rear of the frame 66. Side covers 84 and 86 are mounted on the left and right side of the covers 80 and 82. A microphone receiving opening 88 is formed in the lower portion of the front cover 80. An infrared receiving window 90 is formed in the upper portion of the front cover 80 and an infrared element is provided in the infrared receiving window 90. A power display LED 92 is provided in the upper portion of the front cover 80. An eye bolt 94 for connecting a wire for preventing falling down of the casing is provided in the upper portion of the rear cover 82. The front cover 80, rear cover 82 and side covers 84 and 86 constitute a cylindrical casing 94 having an oval cross section shown in FIG. 5.

The sound field control unit 62 has a height of about 1.5 m to 2.0 m and is erected on the floor. If necessary, the base 64 may be fixed on the floor by means of screws. Sound from the loudspeaker system 72 is propagated upwardly from the upper opening portion 96. The microphone unit 78 is disposed on the side of the front panel 80 of the casing 94 to collect sound about the sound field control unit 62. The infrared receiving window 92 receives an infrared command signal transmitted by an infrared remote control transmitter. The power display LED 92 is lighted when the power of the sound field control unit 62 is on. The microphone unit 78, loudspeaker system 72 and power display LED 92 are connected to the circuit unit 68 provided in the casing 94.

Figure 7:
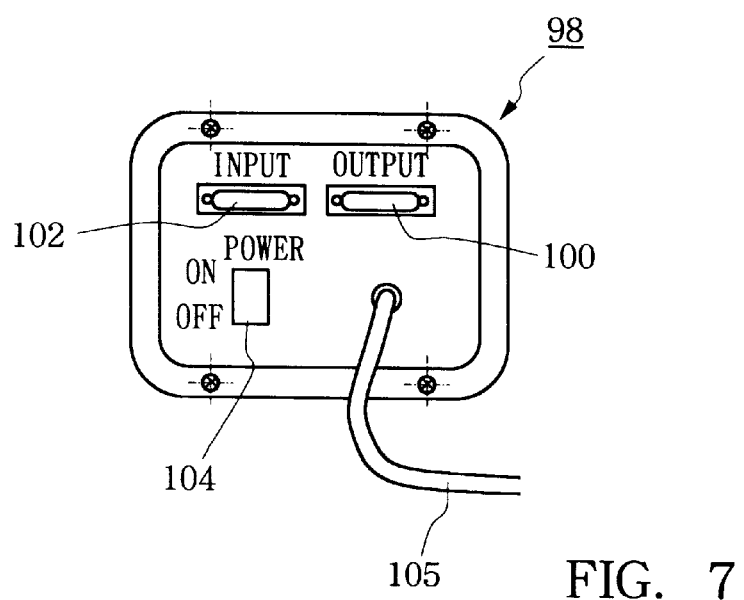
FIG. 7 is a view showing a rear panel provided on the back side of the sound field control unit shown in FIG. 5.

A rear panel 98 shown in FIG. 7 is provided in the lower portion of the rear cover 82. On the rear panel 98 are provided a male connector 100 as a forward direction output connector (reverse direction input connector) and a female connector 102 as a forward direction input connector (reverse direction output connector). A forward direction signal received from the connector 102 is applied to the circuit unit 68 and utilized therein and is outputted from the connector 100. A reverse direction (return) signal received from the connector 100 is applied to the circuit unit 68 and utilized therein and is outputted from the connector 102. A main power switch 104 is disposed on the rear cover 82. Power for the sound field control unit 62 is supplied from a power cord 105. The connectors 100 and 102 are connected to the circuit unit 68 in the casing 94 through signal lines (not shown). Transmission cables are connected to the connectors 100 and 102 from outside.

Figure 8:
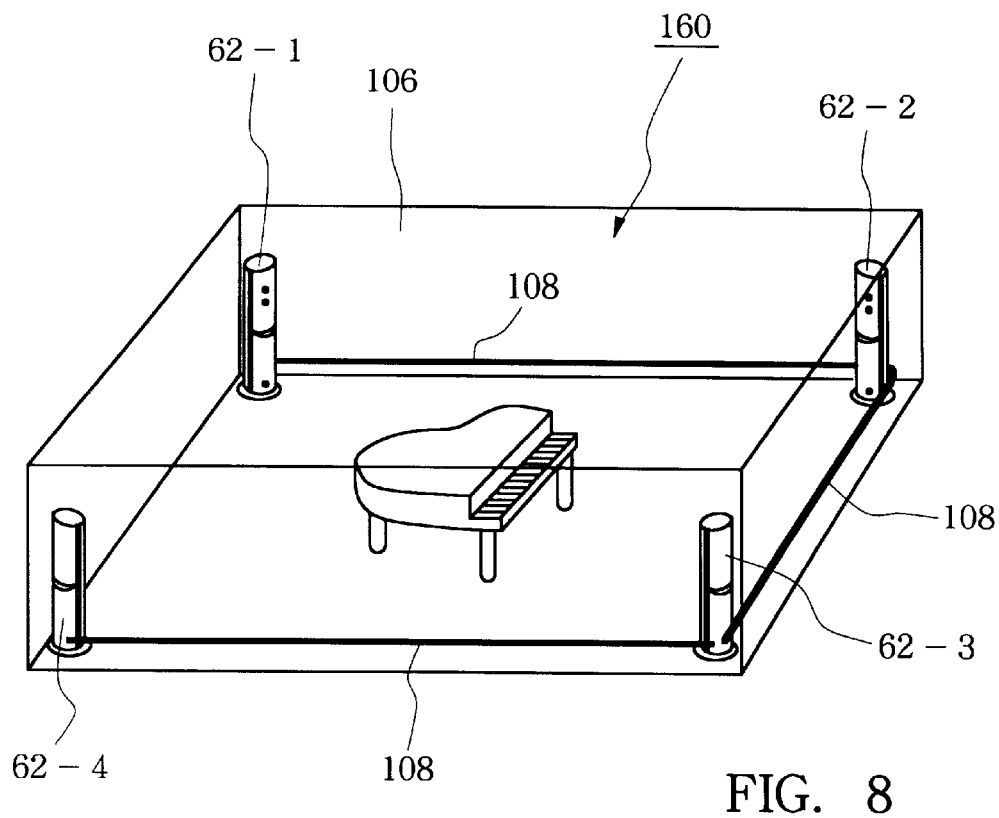
FIG. 8 is a perspective view showing an example of the sound field control unit of the invention which shows an example of introduction of the sound field control device of FIG. 5.

An example of arrangement of the sound field control units in a room is shown in FIG. 8. A room 106 has a space of about 20 square meters to 100 square meters and four sound field control units 62-1 to 62-4 are provided at four corners of the room 106. The sound field control units 62-1, 62-2, 62-3 and 62-4 (hereinafter referred to as units A, B, C and D) are of the same construction each of which is constructed as shown in FIGS. 5 to 7. The units A to D are connected to one another by connecting the units A and B, units B and C, and units C and D with three composite cables (transmission cables) 108 and these units A to D as a whole constitute a sound field control unit 160.

Figure 9:
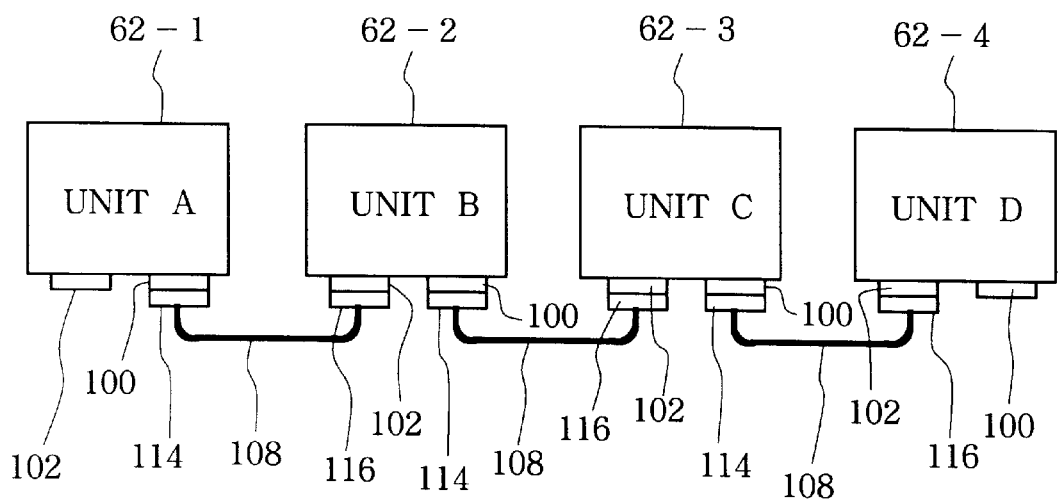
FIG. 9 is a view schematically showing connection of composite cables 108 shown in FIG. 8.

Connection of the units A to D is schematically shown in FIG. 9. The composite cables 108 are connected in one end thereof to female connectors 114 and in the other end thereof to male connectors 116. The connectors 114 are connected to the connectors 100 of the sound field control units 62 and the connectors 116 are connected to the connectors 102 of the other sound field control units 62.

On the composite cables 108 are transmitted collected sound signals and the control signals (command signals) of the respective units A to D. The collected sound signals are transmitted in a transmission system which, for example, is similar to AES/EBU format. That is, two-channel (two units) signals are assigned on a time shared basis to a pair of signal lines (i.e., +line and −line) in the composite cable 108 and these signals are transmitted on a two-channel-serial-24 bit basis. In the composite cable 108 are provided also forward direction and reverse direction signal lines for the same channel. Accordingly, four collected sound signals collected in the units A to D are transmitted via the eight signal lines in the composite cable 108. There are four additional signal lines in the composite cable 108 so that the composite cable 108 is composed of twelve signal lines in all. Assignment of signals to these twelve signal lines is shown below.

| Signal line | Type of signal | Direction | Polarity | Unit of collected sound signal |
|---|---|---|---|---|
| 1 | collected sound signal | forward | + | A + B |
| 2 | collected sound signal | forward | − | A + B |
| 3 | collected sound signal | forward | + | C + D |
| 4 | collected sound signal | forward | + | C + D |
| 5 | collected sound signal | reverse | + | A + B |
| 6 | collected sound signal | reverse | − | A + B |
| 7 | collected sound signal | reverse | + | C + D |
| 8 | collected sound signal | reverse | − | C + D |
| 9 | control signal | | + | |
| 10 | control signal | | − | |
| 11 | word clock | | | |
| 12 | ground | | | |

According to this assignment, a transmission path of forward direction (A to B to C to D) and a transmission path of reverse direction (D to C to B to A) are formed by the three composite cables 108 connecting the units A to D together in FIG. 9 and collected sound signals and control signals of all units A to D are transmitted to each of the three composite cables 108. For example, a collected sound signal in the unit B is transmitted to the units C and D through the signal lines 1 and 2 (i.e., forward lines of A+B), turned back by the unit D and transmitted further to the unit A through the signal lines 5 and 6 (i.e., reverse lines of A+B).

A CPU provided in each of the units A to D has a function of automatically judging which of the units A to D is the self-unit. This judgement is made in the following process. When the units A to D are connected by the three composite cables 108, there occur two units in which the composite cable 108 is not connected to the male connector 100 or the female connector 102. A unit in which no cable is connected to its female connector 102 recognizes the self-unit as a starting terminal and therefore the unit A and transmits numerical value 1 to the adjacent unit through the control signal line. The unit which has received the numerical value 1 recognizes the self-unit as the unit B and thereupon adds 1 to the numerical value 1 and transmits numerical value 2 to the adjacent unit. The unit which has received the numerical value 2 recognizes the self-unit to be the unit C and thereupon adds 1 to the numerical value 2 and transmits numerical value 3 to the adjacent unit. The unit which has received the numerical value 3 recognizes the self-unit to be the unit D and recognizes also that the self-unit is an ending terminal since no cable is connected to the male connector 100 and thereupon adds 1 to the numerical value 3 and sends back numerical value 4 to the unit of the channel A. By sending back of the numerical value 4, the channel A recognizes that the total number of units is 4.

In this manner, each of the units A to D automatically recognizes the position which is assigned to it and, according to its position, it determines the direction of transmission of the collected sound signal of the self-unit. That is, the units A to C transmit their collected sound signals in forward direction (turning back at the unit D) and the unit D transmits its collected sound signal in reverse direction. By this arrangement, collected sound signals of all units A to D are transmitted on the three composite cables 108 connecting the units A to D to one another. The CPU of the unit A controls the entire units A to D and send commands (e.g., a command to execute the automatic adjustment in the order of the units A, B, C and D) to the other units B to D. The unit A also performs the function of a clock master and master clocks produced in the unit A are supplied on the word clock line in the composite cable 108. By common using of this master clock by the other units B to D, synchronization of the entire units A to D is achieved. A remote control signal which is received by one of the infrared receiving windows 90 of the units A to D is applied not only to the particular unit but to the other units through the remote control signal lines in the composite cables 108. Thus, whichever unit receives the remote control signal, the remote control signal is transmitted to all of the units A to D.

Transmission of control signals among the units A to D will now be described. The control signal lines consist of two lines of a HOT (+) line and a COLD (−) line. When these control signal lines are not used, i.e., when none of the units transmits a control signal, both of the two lines become (+) and only when these lines are used, they become (+) and (−). This state of use is hereinafter called BUSY. By this state, whether the control signal lines are being used or not is judged. Control signals are all transmitted in the form of a bunch of data called "packet". A unit which intends to transmit a control signal first examines the state of the control signal lines. If the lines are BUSY, i.e., in use, the unit awaits a state where the lines become empty. When the control signal lines have become empty, the unit brings itself to the state of BUSY to acquire the right of transmission and starts transmission. When the control signal lines become BUSY for a reason of a unit other than the self-unit, this signifies that the other unit is ready for transmission and, in this case, the self-unit enters a signal receiving mode.

Figure 1:
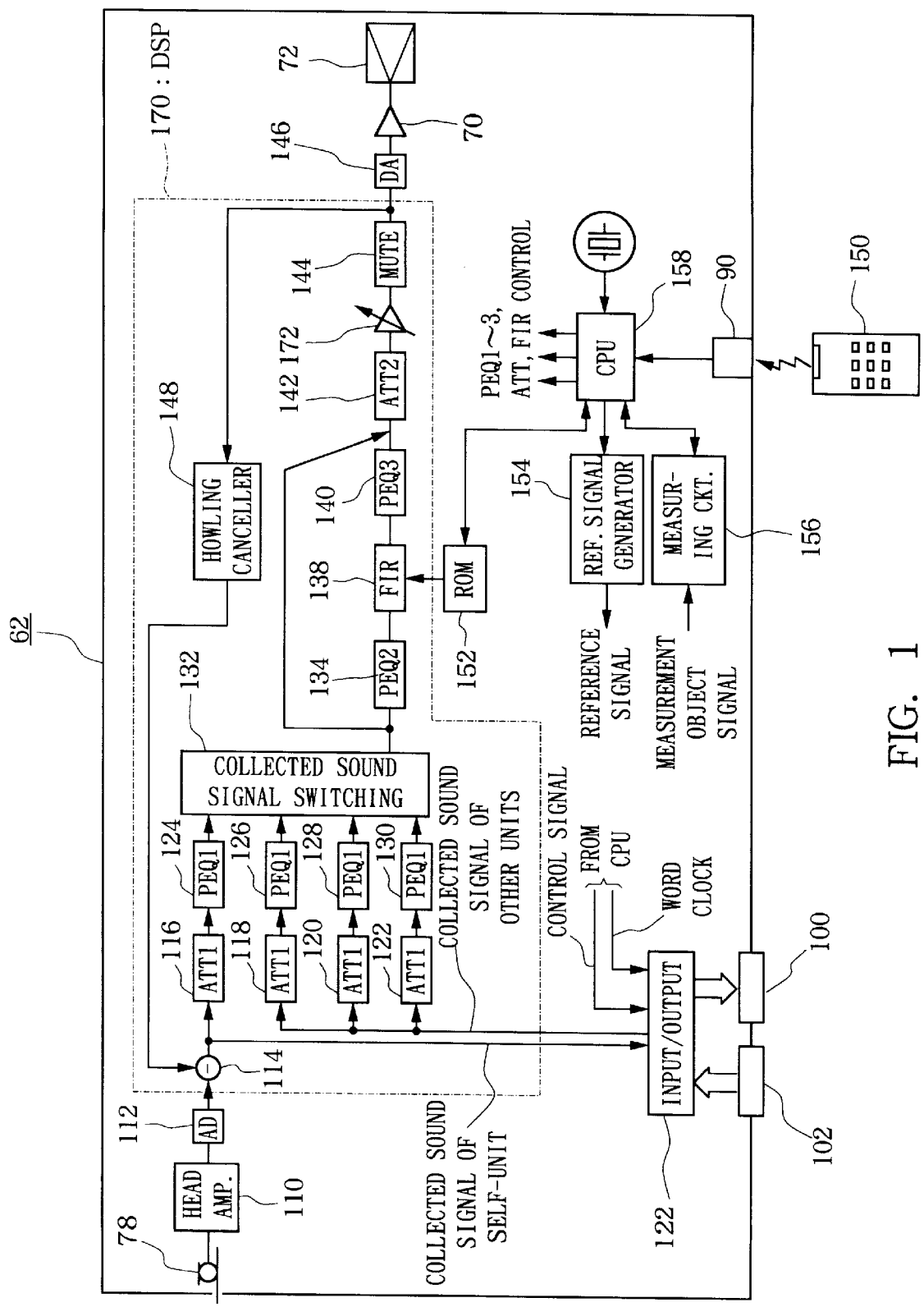
FIG. 1 is a block diagram showing an embodiment of the sound field control unit made according to the invention which is an interior circuit diagram of the sound field control unit shown in FIG. 5.
Figure 2:
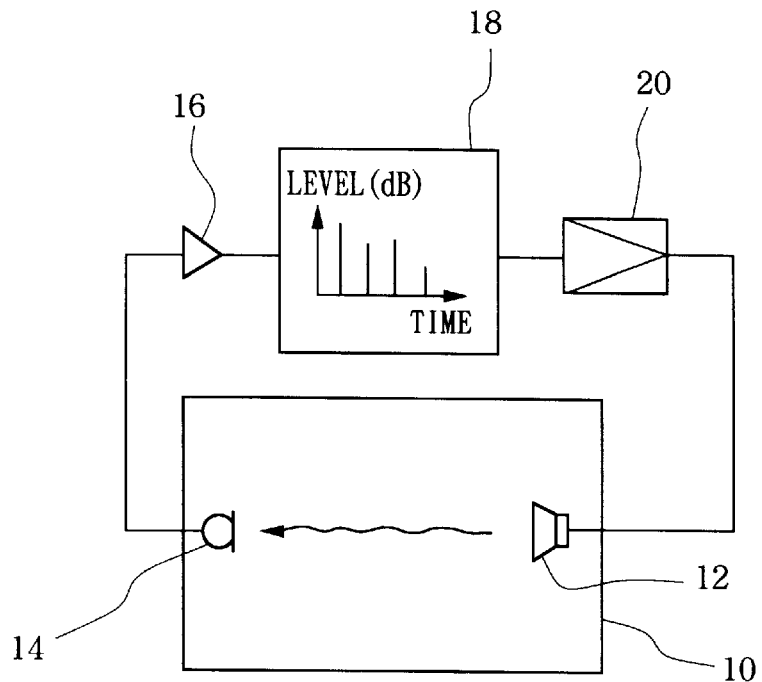
FIG. 2 is a diagram showing the principle of acoustic feedback.
Figure 3:
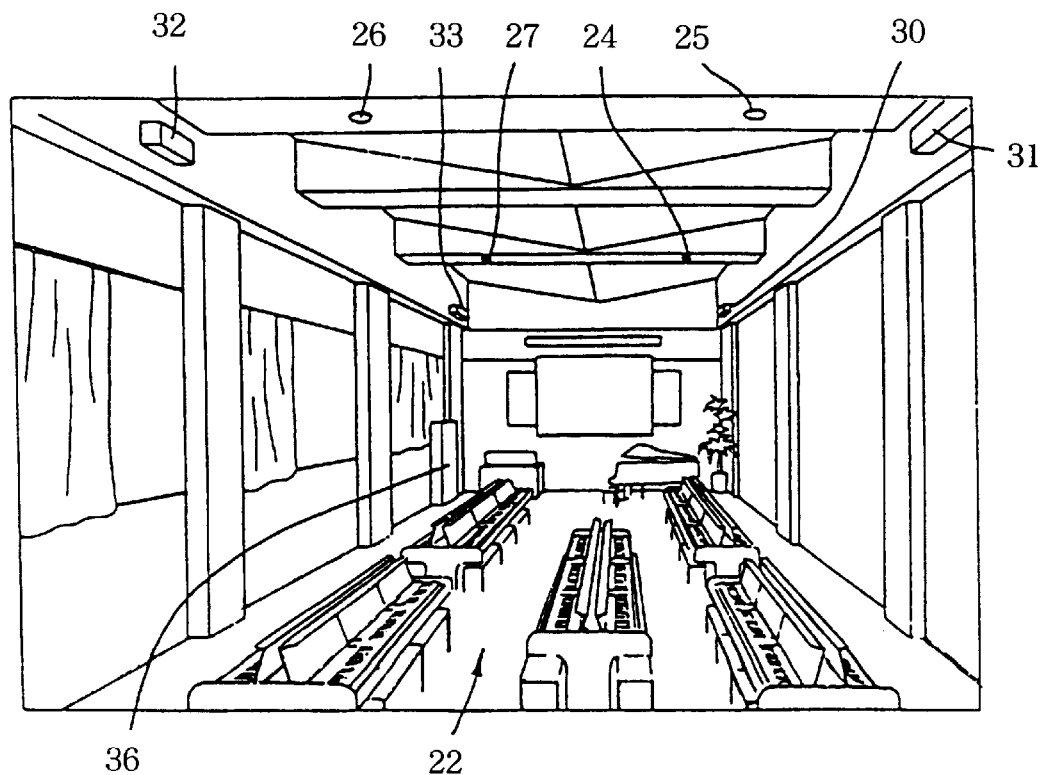
FIG. 3 is a view showing arrangement of the prior art example of acoustic feedback.
Figure 4:
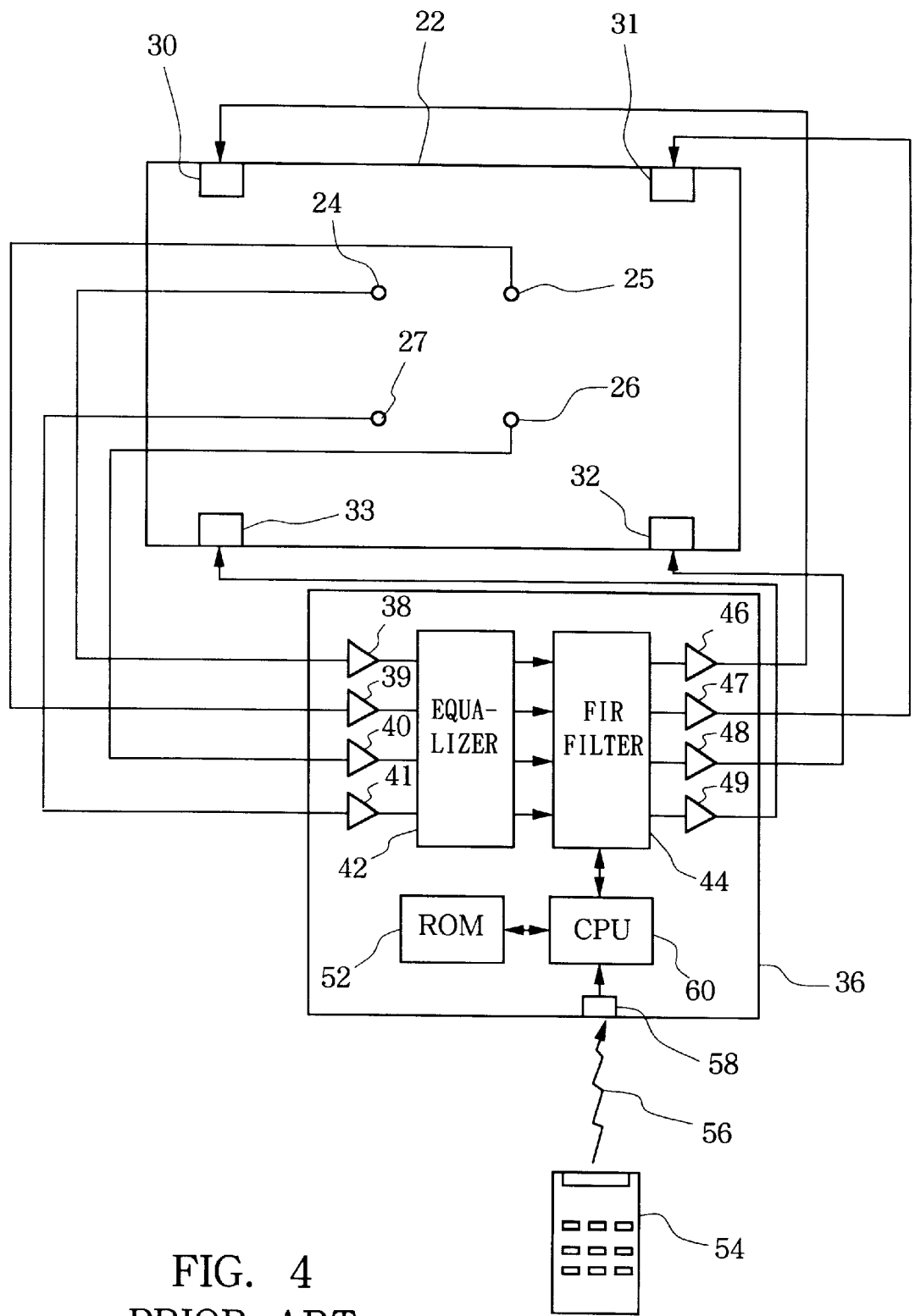
FIG. 4 is a block diagram showing the circuit construction of the system shown in FIG. 3.

A circuit structure of the sound field control unit 62 is shown in FIG. 1. In FIG. 1, a portion enclosed by a chain-and-dot line 170 can be constructed of a DSP (digital signal processor). A collected sound signal collected by the microphone unit 78 is supplied through a head amplifier 10 to an analog-to-digital converter 112 and converted thereby to a digital signal. The digital signal is supplied to a collected sound signal switching circuit 132 through a subtractor 114, an attenuator 116 and a programmable equalizer 124. Collected sound signals of the other units applied through an input/output circuit 122 are supplied to the collected sound signal switching circuit 132 through attenuators 118, 120 and 122 and programmable equalizers 126, 128 and 130. The collected sound signal switching circuits 132 sequentially switches the collected sound signals and provides the selected signal to a posterior circuit.

Figure 10:
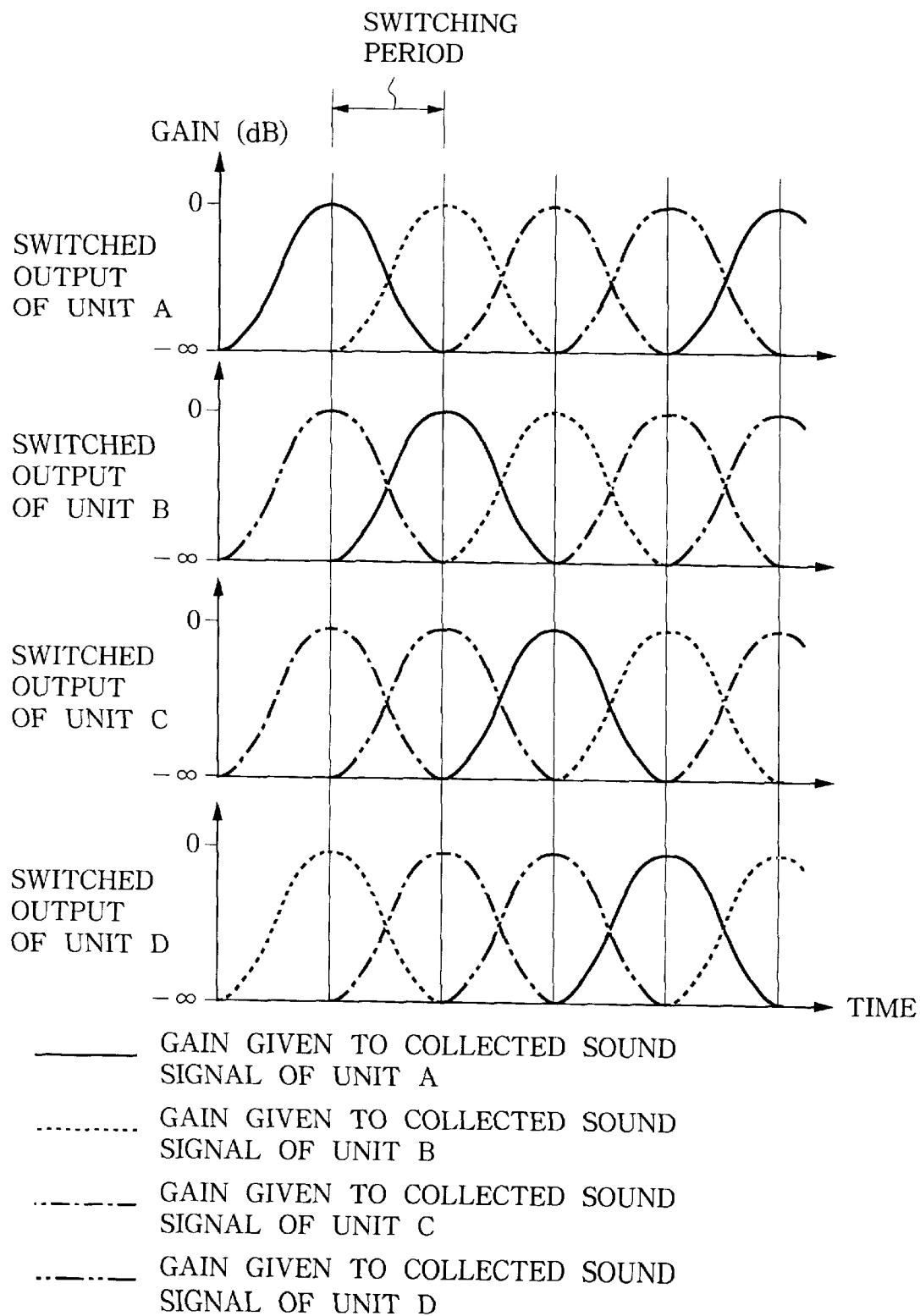
FIG. 10 is a diagram showing an example of operation of the collected sound signal switching circuit of FIG. 1.

An example of switching of the collected sound signals by the collected sound signal switching circuit 132 in each of the units A to D is shown in FIG. 10. According to this switching, collected sound signals reproduced by the units A to D are sequentially switched and, therefore, the transmission frequency characteristic is averaged owing to a space averaging effect with resulting reduction in coloration and enlargement of a howling margin. The period of switching can be set, for example, to the same to half of reverberation time in the room.

The attenuators 118, 120 and 122 and the programmable equalizers 126, 128 and 130 are provided for, when the collected sound signal switching circuit 132 is selectively outputting a collected sound signal of the other unit (i.e., during a loop of the other unit) and the transmission characteristic and gain of the other unit is different from the transmission characteristic and gain provided when a collected sound signal of the self-unit is selectively outputted, adjusting the frequency characteristic and gain of the loop of the other unit on the basis of the frequency characteristic and gain of the loop of the self-unit. By this arrangement, differences in location etc. among the respective units can be compensated for and the device is adapted for use under special conditions such as in an oblong room or in a room where the respective units are disposed at locations where they are not seen from one another. Since the frequency characteristic and gain of the loop of the self-unit are adjusted by the programmable equalizer 140 and the attenuator 142 as will be described later, the attenuator 116 for the loop of the self-unit may normally remain at gain 1 and the programmable equalizer 124 may remain at a flat characteristic at gain 1.

The collected sound signal of the self-unit and the collected sound signals of the other units transmitted from the preceding unit are transmitted to the adjacent unit through the input/output circuit 122.

Figure 11:
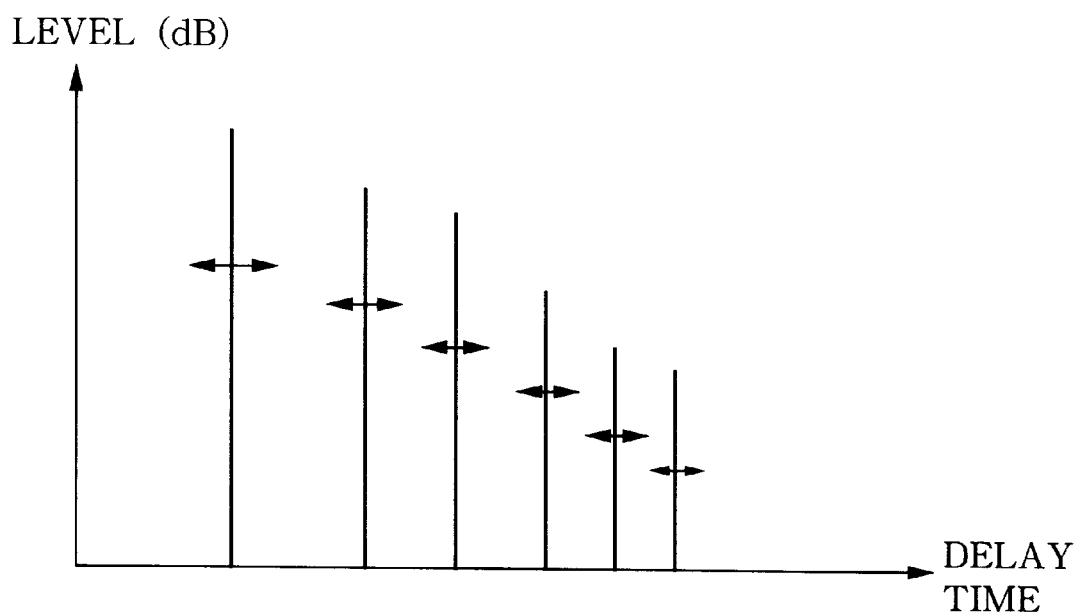
FIG. 11 is a diagram schematically showing changing operation on time base of the FIR filter of FIG. 1.

A collected sound signal provided from the collected sound signal switching circuit 132 is corrected in its frequency characteristic (correction of frequency characteristic in a closed loop) by a programmable equalizer 134. An initial reflected sound is produced by an FIR filter 138 and it is corrected in its frequency characteristic (correction of frequency characteristic in an open loop as to the loop of the self-unit) by a programmable equalizer 140 and adjusted in its gain in the open loop as to the loop of the self-unit by an attenuator 142. Parameters of the FIR filter 138 are changed continuously and randomly on time base as shown in FIG. 11. The frequency characteristic of the FIR filter 138 is thereby averaged with resulting reduction in coloration and enlargement in the howling margin. The variation in the parameters on time base can be achieved by moving an output tap of the FIR filter 138 irrelevantly at a variation width of, e.g., 0.25 msec to 5 msec. The output of the attenuator 142 is supplied through a volume 172, a muting circuit 144 and an amplifier unit 70 to the loudspeaker system 72 where the reflected sound is reproduced.

A howling canceller 148 is provided for preventing occurrence of howling by feeding back of a reproduced sound of a collected sound signal of the self-unit directly to the microphone of the self-unit. The howling canceller 148 feeds back the collected sound signal to the subtractor 114 at a timing at which the collected sound signal is reproduced in the self-unit to cancel the signal fed back from the loudspeaker system 72 of the self-unit directly to the microphone unit 78 of the self-unit.

An infrared remote control transmitter 150 performs command operations including an ON-OFF of power sources of the units A to D, a reverberation pattern switch command and an adjustment mode start command. Upon issuance of the reverberation pattern switch command (selection command), reflected sound parameter of the corresponding reverberation pattern is read from a ROM 152 in the sound field control unit 62 and set in the FIR filter 138 to change over the reverberation pattern.

The adjustment mode for an adjustment which is conducted for the loop characteristic initially when the sound field control unit 62 is installed in the room will now be described.

Figure 12:
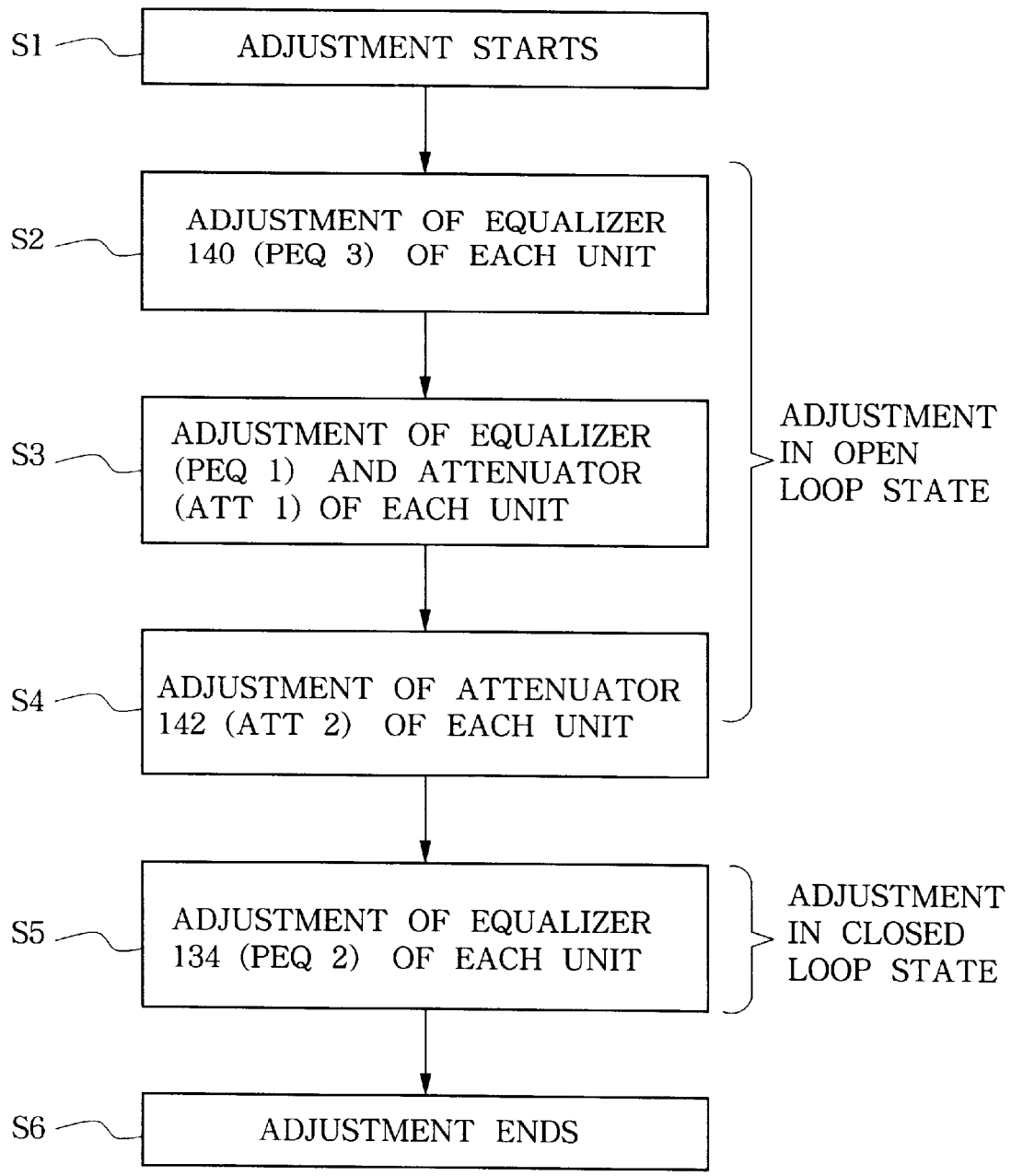
FIG. 12 is a flow chart showing an automatic adjustment operation by the sound field control unit of FIG. 1.

Upon start of the adjustment mode by the command from the infrared remote control transmitter 150, the adjusting operation is performed fully automatically by the control of the CPU 158 of the unit A. Progress of the adjusting operation is controlled by the CPU 158 in the unit A which constitutes a core of the entire system. Routine of the automatic adjusting operation is shown in FIG. 12.

Upon issuance of a command for starting adjustment (S1), adjustment in an open loop is initially started. Switching of the collected sound signal switching circuit 132 of FIG. 1 is stopped and the loop of the self-unit is maintained in the ON state (i.e., a collected sound signal of the self-unit is continuously produced from the collected sound signal switching circuit 132). A signal path between, e.g., the attenuator 142 and the volume 172 (or between the programmable equalizer 140 and the attenuator 142 or between the FIR filter 138 and the programmable equalizer 140) is interrupted and the loop of the self-unit thereby becomes an open loop. In this state, a reference signal for measurement such as pink noise or white noise is generated by a reference signal generation circuit 154 and this reference signal is applied from the volume 172 (or attenuator 142 or programmable equalizer 140) and reproduced by the loudspeaker system 72. This reproduced signal is fed back to the microphone unit 78 and the collected signal is supplied through the attenuator 116, programmable equalizer 124 of the loop of the self-unit and further through the collected sound signal switching circuit 132 and the programmable equalizer 134 to the FIR filter 138 where a reverberation signal is produced. Frequency characteristic and gain of a signal obtained by passing this reverberation signal through the programmable equalizer 140 and attenuator 142 (or the output of the programmable equalizer 140 or the output of the FIR filter 138) are measured by a measuring circuit 156. The CPU of the self-unit automatically adjusts the programmable equalizer 140 so as to reduce outstanding peaks and thereby flattens the frequency characteristic (S2). Since minute peak dips on the frequency characteristic can be eliminated by averaging resulting from the switching of collected sound signals, frequency which rises in the envelope of the frequency characteristic only is reduced by the automatic adjustment. This operation is sequentially performed for all combinations of the units A to D and the reverberation pattern.

After averaging the frequency characteristic of the loop of the self-unit with respect to all of the units A to D, transmission characteristics and gains are measured by using the reference signal for measurement in the state where collected sound signals from the other units are selected (i.e., loop of the other units) and the attenuators 118, 120 and 122 and the programmable equalizers 126, 128 and 130 are adjusted on the basis of the frequency characteristic and gain of the self-unit so that desired frequency characteristic and gain (e.g., the same characteristic as the loop of the self-unit) can be obtained (S3). For this adjustment, the collected sound signal switching circuit 132 is sequentially switched with respect to the unit A initially to form loops with the unit B, C and D and the attenuators 118, 120 and 122 and programmable equalizers 126, 128 and 130 of the unit A are adjusted. After completion of the adjustment of the unit A, loops with the other units are similarly formed with respect to the units B, C and D and the attenuators 118, 120 and 122 and the programmable attenuators 126, 128 and 130 of these units B, C and D are adjusted. This adjustment in step S3 may be omitted.

Upon completion of this adjustment, the loop is fixed to the loop of the self-unit and the open loop gain of the self-unit is adjusted. By the adjustment of preceding step S2, the frequency characteristic of the loop of the self-unit is expected to have become substantially flat. In the case of an equalizer using an IIR filter, however, irregularity sometimes arises in its characteristic. In other words, the IIR type equalizer is inexpensive but irregularity tends to occur in its characteristic. In case where many IIR type equalizers are used, an amplitude characteristic also is adversely affected and undesirable sharp peaks arise in the frequency characteristic. If there is a portion where the open loop gain is 0 dB or over, oscillation occurs in a closed loop state (i.e., howling). Therefore, a reference signal for measurement is generated to measure the frequency characteristic by the measuring circuit 156 and the attenuator 140 is automatically adjusted so that a peak value in the frequency characteristic will become about the howling level (level above which howling tends to occur) and the loop gain is set at a value below 0 dB (e.g., −12 dB) (S4). This operation is sequentially performed with respect to all combinations of the reverberation pattern with the units A to D.

Adjustment in the open loop state has been completed by the above steps and, nextly, adjustment in a closed loop state is made (S5). The loop is closed and a reference signal for measurement is applied to the closed loop and reproduced from the loudspeaker system 72 while switching by the collected sound signal switching circuit 132 is performed, and frequency characteristic of a feedback signal (collected sound signal) is measured by the measuring circuit 156. The programmable equalizer 134 is adjusted so that the gain of the frequency characteristic will not exceed 0 dB. This operation is sequentially performed with respect to all combinations of the units A to D and the reverberation pattern. The adjusting operation is now completed (S6).

The amounts of adjustment of the programmable equalizers 124, 126, 128, 130, 134 and 140 and the attenuators 116, 118, 120, 122 and 142 are stored in a memory (not shown) in the self-unit. In response to the selective operation of the reverberation pattern, a corresponding amount of adjustment is read out and the programmable equalizers 124, 126, 128, 130, 134 and 140 and the attenuators 116, 118, 120, 122 and 142 are thereby automatically adjusted. As a result, coloration is further reduced and howling margin is further enlarged.

Figure 13:
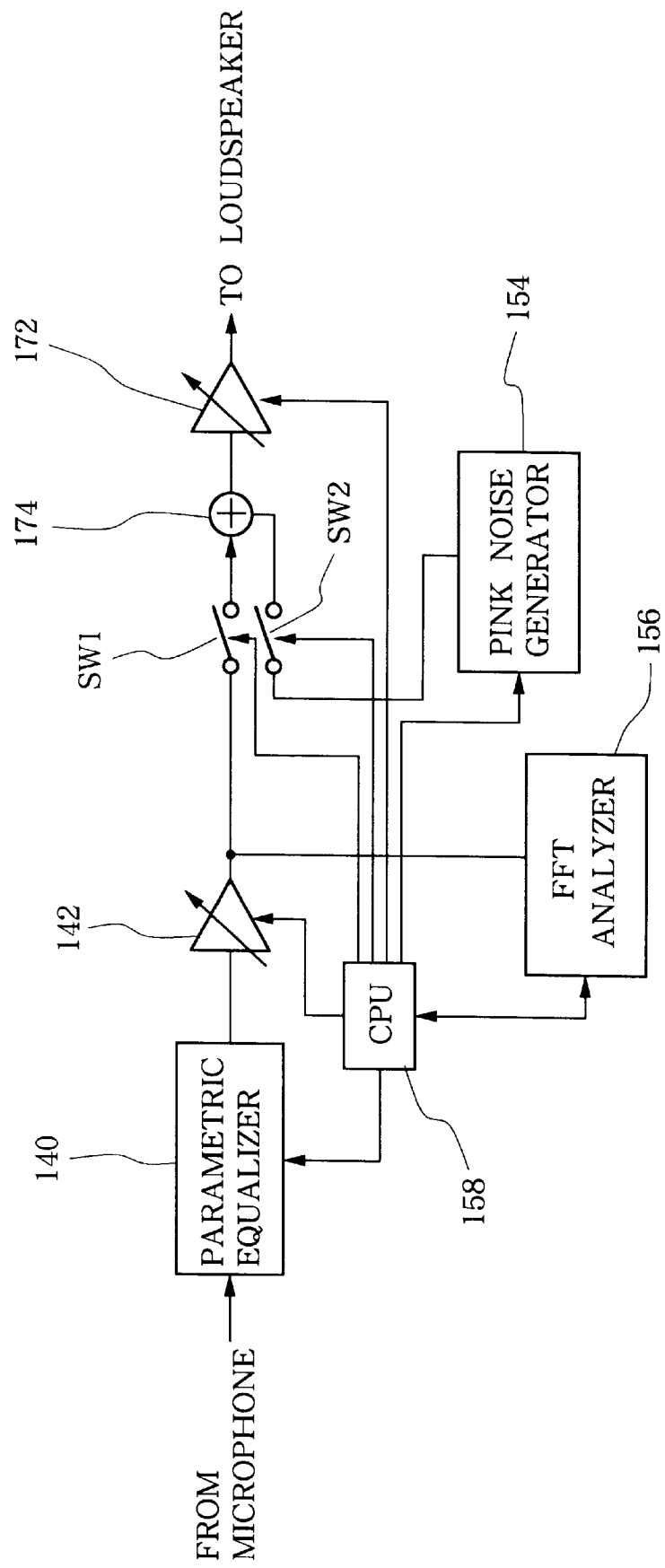
FIG. 13 is a block diagram showing an example of structure for automatically setting characteristic of a parametric equalizer 140 in case a programmable equalizer 140 of FIG. 1 is constructed of a parametric equalizer.

A method for automatic adjustment in a case where the programmable equalizer 140 is constructed of a parametric equalizer will now be described. FIG. 13 shows a portion from the equalizer 140 to the volume 172 in FIG. 1 during adjustment. In the parametric equalizer 140, a center frequency, gain and selectivity Q can be set. A switch SW1 and an adder 174 are provided between the attenuator 142 and the volume 172. The reference signal generation circuit 154 is constructed of, e.g., a pink noise generator. Pink noise generated by this circuit 154 is added by the adder 174 through a switch SW2. The measuring circuit 156 is constructed of, e.g., an FFT analyzer. On-off switching of the switches SW1 and SW2 during the automatic adjustment and other necessary operations are automatically carried out in response to commands from the CPU 158.

A routine for automatically adjusting the characteristic of the parametric equalizer 140 will now be described with reference to FIG. 14.

(1) FFT Measurement (S11)

Upon issuance of an automatic adjustment command, the characteristic of the parametric equalizer 140 becomes flat (characteristics of the other equalizers PEQ1 and PEQ2 also become flat). The gain of the attenuator 142 is set at 0 dB and the volume 172 is made maximum. The switch SW1 is turned off and the loop is thereby interrupted whereas the switch SW2 is turned on and pink noise from the pink noise generator 154 is thereby supplied into the signal path. This pink noise is reproduced by the loudspeaker system 72 and collected by the microphone unit 78 through the space in the room. The frequency of the collected sound signal is measured by the FFT analyzer 156.

(2) Smoothing Processing (S12)

Figure 15A:
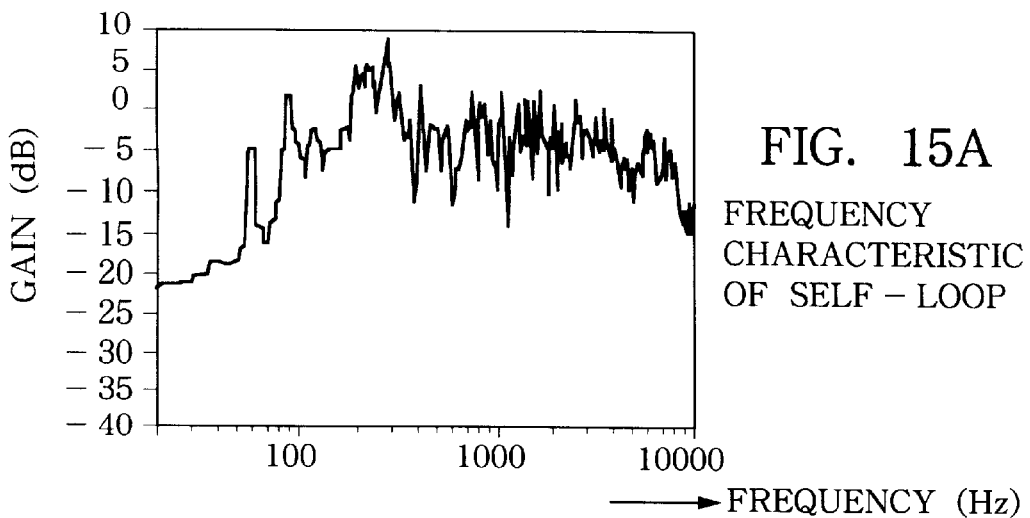
FIGS. 15A, 15B and 15C are frequency characteristic diagrams showing a specific example of a characteristic setting operation by the routine of FIG. 14.
Figure 15B:
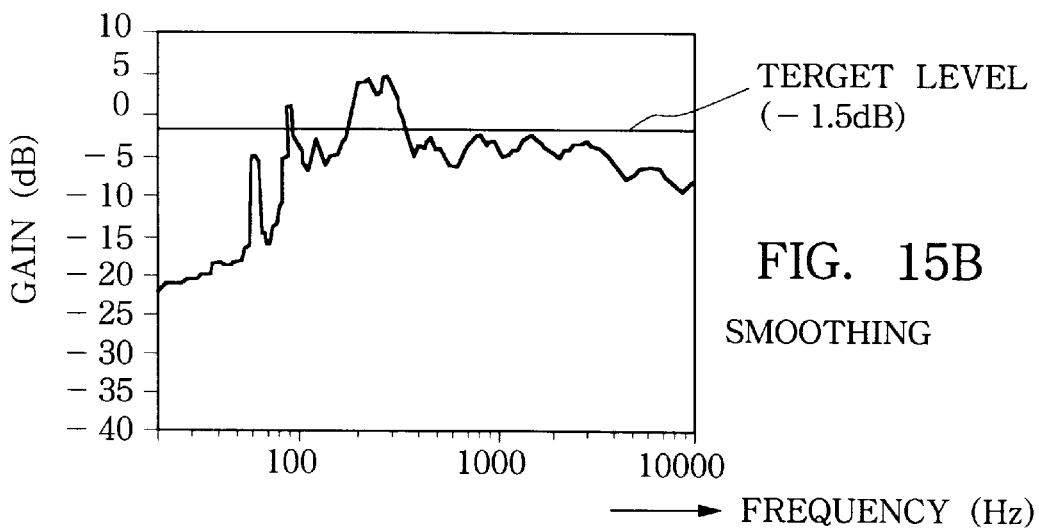

The result of computation by the FFT analyzer 156 becomes, for example, a characteristic as shown in FIG. 15A. For facilitating processing by the CPU 158, this characteristic is smoothed as shown in FIG. 15B. The smoothing is achieved by, for example, averaging 10 points of the FFT data. Since, however, the FFT data has a linear frequency width, the low frequency region thereof (below 100 Hz) is not averaged as viewed in the logarithm axis but the number of points for averaging is gradually increased in a middle frequency region (100 Hz to 1 kHz) and, in the high frequency region (above 1 kHz), data at ±10 points is averaged for smoothing. Averaging at ±10 points means averaging of data at ±10 data with respect to all data of FFT. Assuming that original FFT data is represented by f (x) and data after averaging by F(X), F(X) becomes $$F(x) = \frac{1}{10} \sum_{n=r-10}^{r+10} f(n)$$

and, by carrying out calculation of X with respect to all of the FFT data f(x), FFT average data F(X) of the same number as the original data f(x) can be calculated.

(3) Setting of Target Level of the Equalizer (S13)

An average value of, e.g., the middle frequency region (500 Hz to 2 kHz) of the original FFT data is used as a target level of equalizing. In the example of FIG. 15B, −1.5 dB is set as the target level. The average value of 500 Hz to 2 kHz is taken because this region because, talking from experience, this region is one which is least affected by conditions of the room.

(4) Detection of a Peak and Setting of Characteristic (S14–S16)

A peak position in the smoothed frequency characteristic (i.e., a top portion of a peak of the highest level among plural peaks existing in the frequency characteristic) is detected. If, for example, a portion in the frequency characteristic has exceeded the target level as shown in FIG. 16A, frequency $f_0$ at the peak position and frequencies $f_1$, $f_2$ at crossing points with the target level are detected. Then, ratios between the frequencies $f_1$, $f_2$ at the crossing points and the peak position frequency $f_0$ $$R_1 = f_1/f_0$$

$$R_2 = f_0/f_2$$

are calculated and a larger frequency ratio is adopted.

A reason for adopting the larger frequency ratio is as follows: Assuming that there is a frequency characteristic as shown in FIG. 16A, equalizer characteristics as shown in FIG. 16B matching the frequencies $f_1$ and $f_2$ are conceivable. In this case, the equalizer characteristics EQ1 matching the frequency $f_1$ of the small frequency ratio becomes a broad characteristic with the result that it cuts off even a necessary characteristic region. Therefore, for preventing such cutting off of a larger portion of the characteristic than necessary, the sharp equalizer characteristic EQ2 matching the frequency $f_2$ of the large frequency ratio is selected. In this case, however, there is left a portion in the equalizer characteristic which should preferably be cut off, a simulation computation in step S17 to be described later is performed for finally setting the equalizer characteristic.

Then, difference GdB between the target level and the peak position level is calculated. On the basis of the frequency ratio R1 or R2 and the level difference GdB, Q which is necessary for lowering the peak position level below the target level is calculated. For this purpose, a table as shown in Table 1 below listing frequency ratios for all combinations of the level difference GdB and Q may be prepared in a memory (not shown) and Q at which a frequency ratio nearest to the calculated frequency ratio under the calculated level difference GdB can be obtained may be selected.

TABLE 1

| G (dB) | Q = <1.0> | <1.2> | <1.5> | <2.0> | <3.0> | <5.0> | <9.0> |
|---|---|---|---|---|---|---|---|
| −0.5 | 0.4332, | 0.4937, | 0.5656, | 0.6501, | 0.7487, | 0.8404, | 0.9077, |
| −1.0 | 0.4237, | 0.4840, | 0.5565, | 0.6416, | 0.7425, | 0.8361, | 0.9054, |
| −1.5 | 0.4135, | 0.4749, | 0.5472, | 0.6336, | 0.7363, | 0.8318, | 0.9023, |
| −2.0 | 0.4040, | 0.4650, | 0.5380, | 0.6260, | 0.7302, | 0.8269, | 0.9000, |
| −2.5 | 0.3946, | 0.4554, | 0.5287, | 0.6174, | 0.7229, | 0.8221, | 0.8970, |
| −3.0 | 0.3852, | 0.4457, | 0.5196, | 0.6089, | 0.7164, | 0.8186, | 0.8939, |
| −3.5 | 0.3753, | 0.4362, | 0.5103, | 0.5999, | 0.7097, | 0.8130, | 0.8917, |
| −4.0 | 0.3660, | 0.4264, | 0.5006, | 0.5916, | 0.7021, | 0.8083, | 0.8887, |
| −4.5 | 0.3563, | 0.4169, | 0.4914, | 0.5832, | 0.6958, | 0.8035, | 0.8856, |
| −5.0 | 0.3471, | 0.4074, | 0.4817, | 0.5741, | 0.6888, | 0.7982, | 0.8819, |
| −5.5 | 0.3376, | 0.3979, | 0.4726, | 0.5656, | 0.6815, | 0.7927, | 0.8789, |
| −6.0 | 0.3286, | 0.3879, | 0.4628, | 0.5565, | 0.6735, | 0.7875, | 0.8759, |
| −6.5 | 0.3193, | 0.3786, | 0.4529, | 0.5472, | 0.6658, | 0.7829, | 0.8723, |
| −7.0 | 0.3100, | 0.3693, | 0.4433, | 0.5380, | 0.6582, | 0.7769, | 0.8693, |
| −7.5 | 0.3014, | 0.3094, | 0.4336, | 0.5287, | 0.6501, | 0.7711, | 0.8649, |
| −8.0 | 0.2923, | 0.3504, | 0.4241, | 0.5196, | 0.6427, | 0.7652, | 0.8612, |
| −8.5 | 0.2834, | 0.3407, | 0.4145, | 0.5103, | 0.6343, | 0.7589, | 0.8583, |
| −9.0 | 0.2751, | 0.3319, | 0.4050, | 0.5006, | 0.6260, | 0.7539, | 0.8539, |
| −9.5 | 0.2663, | 0.3224, | 0.3956, | 0.4914, | 0.6178, | 0.7468, | 0.8503, |
| −10.0 | 0.2582, | 0.3131, | 0.3856, | 0.4817, | 0.6093, | 0.7407, | 0.8460, |
| −10.5 | 0.2498, | 0.3044, | 0.3762, | 0.4723, | 0.6009, | 0.7345, | 0.8425, |
| −11.0 | 0.2415, | 0.2953, | 0.3669, | 0.4628, | 0.5927, | 0.7284, | 0.8375, |
| −11.5 | 0.2338, | 0.2864, | 0.3572, | 0.4529, | 0.5835, | 0.7211, | 0.8332, |

TABLE 1-continued

| G (dB) | Q = |  |  |  |  |  |  |
|---|---|---|---|---|---|---|---|
|  | <1.0> | <1.2> | <1.5> | <2.0> | <3.0> | <5.0> | <9.0> |
| −12.0 | 0.2257, | 0.2780, | 0.3482, | 0.4433, | 0.5752, | 0.7151, | 0.8291, |

After determining the peak position frequency $f_0$, level difference GdB and Q, the characteristic of one band of the parametric equalizer 140 is set to the center frequency $f_0$, gain G and selectivity Q by using these values.

The above described routine will be further explained with respect to the example of FIG. 15B. The peak position frequency $f_0$ is 280 Hz, frequencies at the crossing points with the target level is $f_1$=180 Hz and $f_2$ =360 Hz and the frequency rations are $$R_1=180/280=0.6429$$

$$R_2=280/360=0.7778.$$

Therefore, the larger ratio $R_2$=0.7778 is adopted. Difference between the target level and the peak position level is G=−7.0 dB. From Table 1, Q=5.0 is adopted as a value of Q at which a frequency ratio nearest to the frequency ratio 0.7778 can be obtained under the level difference −7.0 dB. Thus, the characteristic of the parametric equalizer 140 is set to the center frequency of 280 Hz, gain of −7.0 dB and Q of 5.0.

(5) Simulation (S17)

Figure 15C:
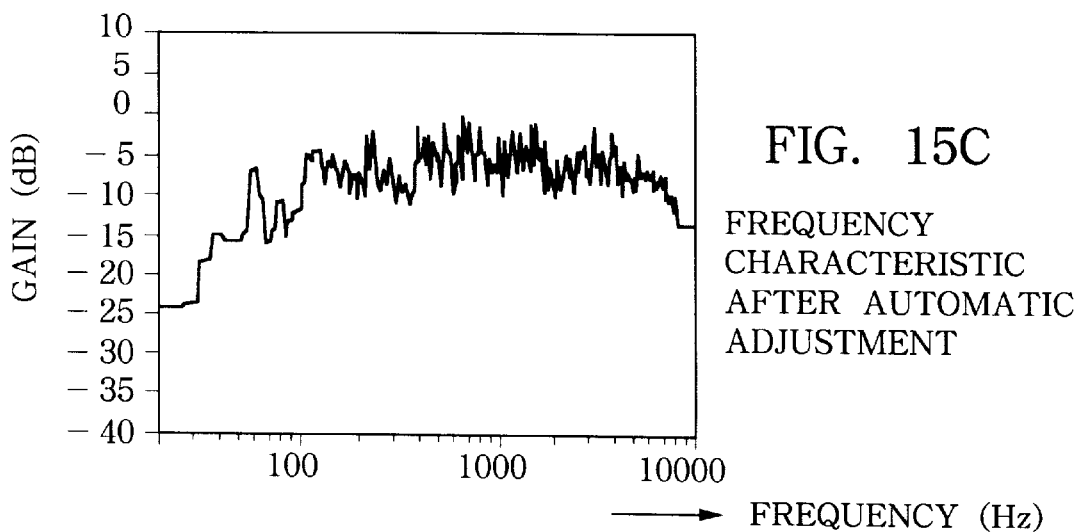

Frequency characteristic resulting from equalizing by the parametric equalizer 140 whose characteristic has been set in the above described manner is simulated in the CPU 158. More specifically, the frequency characteristic of the parametric equalizer 140 is converted to data in the CPU 158 and this data is subtracted from the smoothed FFT data (FIG. 15B) to estimate the frequency characteristic after equalizing. If a peak which exceeds the target level still exists in the frequency characteristic, characteristic of another band of the parametric equalizer 140 is set by carrying out calculation with respect to this peak by the same routine (S14 to S17) described above. When a peak exceeding the target level has ceased to exist by repeating the above described processing, the setting of the parametric equalizer 140 is completed (S18). A result of equalizing of the characteristic shown in FIG. 15A by using the parametric equalizer 140 which has comleted setting is shown in FIG. 15C. According to FIG. 15C, all portions of the frequency characteristic are below the level of −1.5 dB which has been set as the target level whereby occurrence of howling can be prevented.

Figure 14:
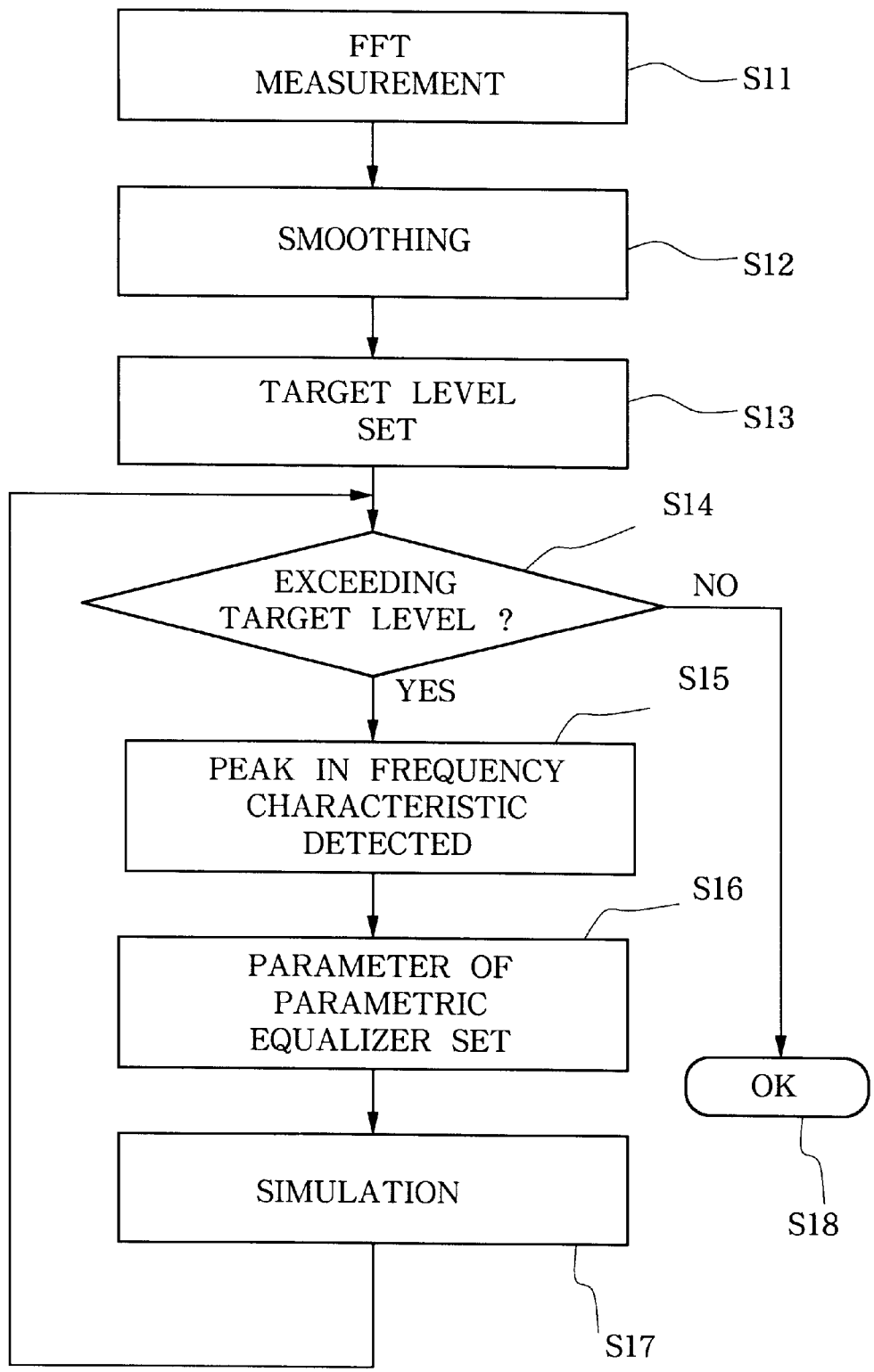
FIG. 14 is a flow chart showing a routine for automatically setting characteristic of the parametric equalizer 140 of the structure shown in FIG. 13.

As to the programmable equalizer 134 (PEQ2) shown in FIG. 1, this equalizer 134 may also be constructed of a parametric equalizer and, by performing the FFT measurement separately in the same manner as has been described with respect to FIG. 14, the characteristic of the equalizer 134 may be set on the basis of result of such FFT measurement. When the parametric equalizer 134 is set, the loop is closed by turning on the switch SW1 of FIG. 13 and the parametric equalizer 140 is set in the above described manner and the other programmable equalizers 124 to 130 (PEQ1) are made in a flat state. When setting of the parametric equalizer 140 (PEQ3) has been completed, a substantially flat frequency characteristic is expected to have been produced but actually peaks like a whisker remains. For removing these peaks one by one, the parametric equalizer 134 is utilized. In this case, for removing the whisker like peaks only and not other portion, Q of the parametric equalizer 134 is fixed to a certain sharp value (about 10.0) and the center frequency $f_0$ and gain G are set on the basis of result of FFT measurement.

The programmable equalizers 124 to 130 (PEQ1) of FIG. 1 may also be constructed of parametric equalizers and FFT measurement may be made in the same manner as in FIG. 14 and characteristic of the equalizers may be set on the basis of the FFT measurement.

Upon completion of the automatic adjustment of characteristics of all equalizers PEQ1, PEQ2 and PEQ3 in the above described manner, the units can be practically used by adjusting the volume 172 to a desired tone volume.

Figure 17:
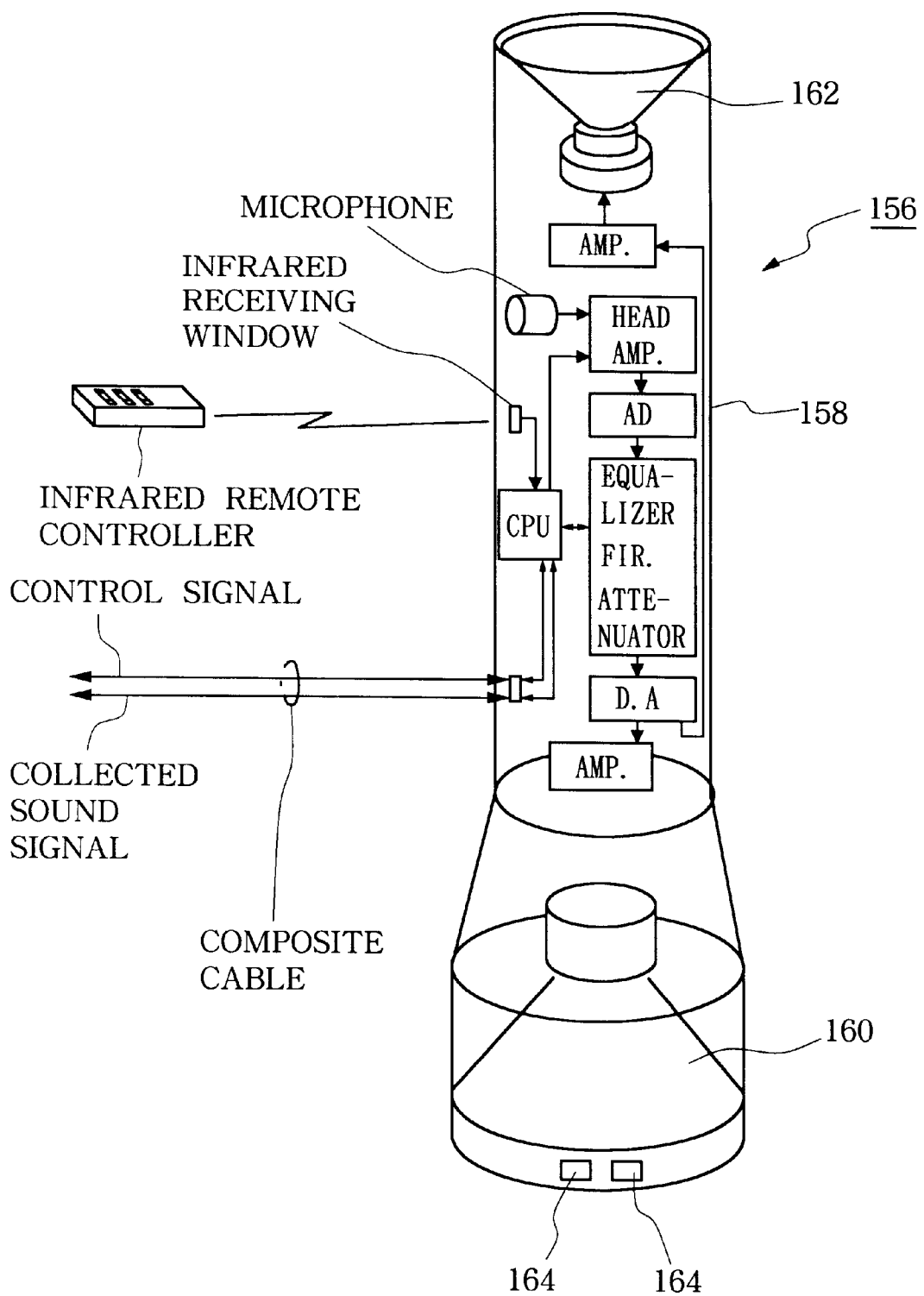
FIG. 17 is a view showing an appearance of another embodiment of the sound field control unit according to the invention.

In the above described embodiment, only one loudspeaker system is provided for one sound field control unit 62. Alternatively, plural loudspeaker systems may be provided for one sound field control unit. This embodiment is shown in FIG. 17. In a sound field control unit 156 of this embodiment, a downwardly facing woofer 160 is provided in the lower portion of a casing 158 and an upwardly facing squawker 162 is provided in the upper end portion of the casing 158. Sound from the woofer 160 is propagated outwardly from an opening 164 formed in the lower end portion of the casing 158. By providing plural loudspeaker systems in this manner, sound can be diffused more widely.

What is claimed is:

1. A sound field control unit comprising:

a microphone collecting sound about a self-unit;

a collected sound signal input-output terminal for outputting a collected sound signal collected by the microphone to outside of the self-unit and inputting a collected sound signal collected by microphone of other units to the self-unit;

a collected sound signal switch for switching the collected sound signal collected by the self-unit and the collected sound signal collected by the other units sequentially and repeatedly;

an FIR filter for producing a reflected sound component of the collected sound signals provided by the collected sound signal switch and imparting it to the collected sound signals;

an amplifier for amplifying the imparted reflected sound component and the collected sound signal;

an equalizer provided in a signal path between an output terminal of the collected sound signal switch and an input terminal of the amplifier for adjusting frequency characteristic of a signal flowing through the signal path; and a loudspeaker for reproducing the output signal which has been amplified by the amplifier, said microphone, collected sound signal input-output terminal, collected sound signal switch, FIR filter, amplifier, equalizer and loudspeaker being assembled integrally together in the self-unit and the self-unit being adapted to be connected to the other units through the collected sound signal input-output terminal by means of transmission cables.

2. A sound field control unit as defined in claim 1 wherein parameters of the FIR filter are shifted continuously and randomly on time base.

3. A sound control device as defined in claim 1 further comprising:

an infrared receiving section for receiving a command signal transmitted by an infrared remote control transmitter;

a command signal input-output terminal for outputting the command signal received by the infrared receiving section to the outside of the self-unit and inputting command signals received by infrared receiving sections of the other units to the self-unit; and a CPU for controlling the component elements of the self-unit in response to the command signals received by the self-unit or inputted from the other units, the self-unit being adapted to be connected to the other units through the command signal input-output terminal by means of transmission cables.

4. A sound field control device as defined in claim 1 which further comprises a measuring device for measuring transmission characteristic and a reference signal generator for generating a reference signal for measuring the transmission characteristic, wherein said equalizer comprises a prior equalizer provided between the collected sound signal switch and the FIR filter and a posterior equalizer provided between the FIR filter and the amplifier, and which further comprises an attenuator provided in a posterior stage of the posterior equalizer, said CPU carrying out, upon receiving a command for adjusting the transmission characteristic, an automatic adjustment program which conducts:

an adjustment in an open loop state in which the output of the collected sound signal switch is fixed to the collected sound signal of the self-unit, a part of the signal path is interrupted to establish the open loop state, the reference signal for measurement is inputted from the interrupted part and reproduced by the loudspeaker, frequency characteristic of a signal collected by the microphone of the self-unit and fed back to the interrupted part at this time is measured by the measuring device, characteristic of the posterior equalizer is adjusted so as to flatten the frequency characteristic, and then the attenuator is adjusted so that gain of the loop becomes a predetermined value, and an adjustment in a closed loop state in which the loop is closed and the reference signal for measuring is supplied to the loop while switching operation by the collected sound signal switch is performed, frequency characteristic of the loop is measured by the measuring device and the characteristic of the equalizer is adjusted so as to flatten the frequency characteristic.

5. A sound field control unit as defined in claim 4 wherein the posterior equalizer is constructed of a parametric equalizer in which a center frequency, gain and Q can be set and the automatic adjustment of the posterior equalizer is conducted such that the measured frequency characteristic is compared with a predetermined target gain and a peak frequency in a portion where the gain exceeds the target gain in the frequency characteristic, difference between the gain at the peak frequency and the target frequency and frequencies at crossing points at which the frequency characteristic crosses the target gain on both sides of the peak frequency are respectively detected, a degree of sharpness of the characteristic is obtained on the basis of the peak frequency, gain difference and frequencies at the crossing points, and the center frequency, gain and Q of the posterior equalizer are determined so as to match the detected or calculated peak frequency, gain difference and the degree of sharpness.

6. A sound field control unit as defined in claim 4 wherein the prior equalizer is constructed of a parametric equalizer in which the center frequency and gain can be set and Q is fixed and the automatic adjustment of the prior equalizer is conducted such that the measured frequency characteristic is compared with a predetermined target gain and a peak frequency in a portion where the gain of the frequency characteristic exceeds the target gain and a difference between the gain at the peak frequency and the target gain are respectively detected, and the center frequency and the gain of the prior equalizer are set so as to match the detected peak frequency and gain difference.

7. A sound field control unit as defined in claim 1 wherein the unit comprises a vertically elongated cylindrical casing which is adapted to be erected on a floor, the loudspeaker is disposed in the casing in such a manner that sound is propagated upwardly from an upper end opening of the cylinder constituting the casing, the microphone is disposed on the side surface of the casing for collecting sound about the casing, an electrical circuit portion including the collected sound signal switch, FIR filter, amplifier and the equalizer is provided in the casing, and the collected sound signal input-output terminal is disposed at location where the transmission cable can be connected from outside.

8. A sound field control device which comprises a plurality of sound field control units as defined in claim 3 installed in a room and connected to one another by means of the transmission cables for transmitting and receiving among one another collected sound signals and command signals of the respective sound field control units by means of the transmission cables and, in which one of the CPUs of the sound field control units is determined as a center CPU and operates as a CPU which controls all of the sound field control units and transmits a command signal to the other sound field control units through the transmission cables so that the other sound field control units carry out an operation corresponding to the command signal.

* * * * *